(12) United States Patent
Rame et al.

(10) Patent No.: US 11,220,727 B2
(45) Date of Patent: Jan. 11, 2022

(54) SUPERALLOY BASED ON NICKEL, MONOCRYSTALLINE BLADE AND TURBOMACHINE

(71) Applicants: Safran, Paris (FR); Safran Aircraft Engines, Paris (FR); Office National D'Etudes et de Recherches Aerospatiales, Palaiseau (FR); Safran Helicopter Engines, Bordes (FR)

(72) Inventors: Jérémy Rame, Moissy-Cramayel (FR); Philippe Belaygue, Moissy-Cramayel (FR); Pierre Caron, Les Ulis (FR); Joël Delautre, Moissy-Cramayel (FR); Virginie Jaquet, Moissy-Cramayel (FR); Odile Lavigne, Paris (FR)

(73) Assignees: Safran, Paris (FR); Safran Aircraft Engines, Paris (FR); Office National D'Etudes et de Recherches Aerospatiales, Palaiseau (FR); Safran Helicopter Engines, Bordes (FR)

(*) Notice: Subject to any disclaimer, the term of this patent is extended or adjusted under 35 U.S.C. 154(b) by 0 days.

(21) Appl. No.: 16/344,722

(22) PCT Filed: Oct. 24, 2017

(86) PCT No.: PCT/FR2017/052918
§ 371 (c)(1),
(2) Date: Apr. 24, 2019

(87) PCT Pub. No.: WO2018/078269
PCT Pub. Date: May 3, 2018

(65) Prior Publication Data
US 2019/0330714 A1 Oct. 31, 2019

(30) Foreign Application Priority Data
Oct. 25, 2016 (FR) ...................... 1660337

(51) Int. Cl.
*B21D 39/00* (2006.01)
*C22C 19/05* (2006.01)
(Continued)

(52) U.S. Cl.
CPC ............ *C22C 19/057* (2013.01); *C30B 29/52* (2013.01); *F01D 5/28* (2013.01); *F01D 5/284* (2013.01)

(58) Field of Classification Search
None
See application file for complete search history.

(56) References Cited

U.S. PATENT DOCUMENTS

| | | | | |
|---|---|---|---|---|
| 5,435,861 | A * | 7/1995 | Khan | C22C 19/057 148/428 |
| 2008/0240926 | A1* | 10/2008 | Kobayashi | B22D 27/045 416/241 R |
| 2012/0028056 | A1* | 2/2012 | Cadoret | C23C 14/025 428/457 |

FOREIGN PATENT DOCUMENTS

| | | | |
|---|---|---|---|
| CA | 1296587 C | 3/1992 | |
| CA | 2276154 A1 * | 1/2000 | ........... C22C 19/057 |

(Continued)

OTHER PUBLICATIONS

International Search Report dated Jan. 29, 2018, in International Application No. PCT/FR2017/052918 (3 pages).
(Continued)

*Primary Examiner* — Seth Dumbris
*Assistant Examiner* — Kim S. Horger
(74) *Attorney, Agent, or Firm* — Bookoff McAndrews, PLLC

(57) ABSTRACT

A nickel-based superalloy comprises in mass percent: 4.0% to 6.0% chromium; 0.4% to 0.8% molybdenum; 2.5% to 3.5% rhenium; 6.2% to 6.6% tungsten; 5.2% to 5.7% aluminum; 0.0 to 1.6% titanium; 6.0% to 9.9% tantalum; 0.0
(Continued)

to 0.7% hafnium; and 0.0 to 0.3% silicon; the balance being constituted by nickel and any impurities.

A monocrystalline blade comprises such an alloy and a turbomachine including such a blade.

11 Claims, 1 Drawing Sheet

(51) Int. Cl.
  *C30B 29/52* (2006.01)
  *F01D 5/28* (2006.01)

(56) References Cited

FOREIGN PATENT DOCUMENTS

| | | | |
|---|---|---|---|
| CN | 1680611 A | 10/2005 |
| CN | 101733610 A | 6/2010 |
| DE | 69903224 T2 | 12/2003 |
| DE | 60035052 T2 | 1/2008 |
| EP | 0 971 041 A1 | 1/2000 |
| EP | 1 211 336 A1 | 6/2002 |
| EP | 1 975 261 A1 | 10/2008 |
| FR | 2780983 A1 | 1/2000 |
| JP | S61284545 A | 12/1986 |
| JP | S 648238 A | 1/1989 |
| JP | H 01234540 A | 9/1989 |
| JP | H10159502 A | 6/1998 |
| JP | 2000034531 A | 2/2000 |
| JP | 2005248655 A | 9/2005 |
| JP | 2011225930 A | 11/2011 |
| RU | 2149202 C1 | 5/2000 |
| RU | 2544954 C2 | 3/2015 |
| WO | 02/22901 A1 | 3/2002 |
| WO | 02/070764 A1 | 9/2002 |

OTHER PUBLICATIONS

Office Action dated Dec. 15, 2020, in Russia Patent Application No. 2019116001 (4 pages).

Office Action dated Nov. 10, 2020, in Chinese Patent Application No. 201780066354.8 (12 pages).

Office Action dated Oct. 5, 2021, in Japanese Patent Application No. 2019-542807 (3 pages).

* cited by examiner

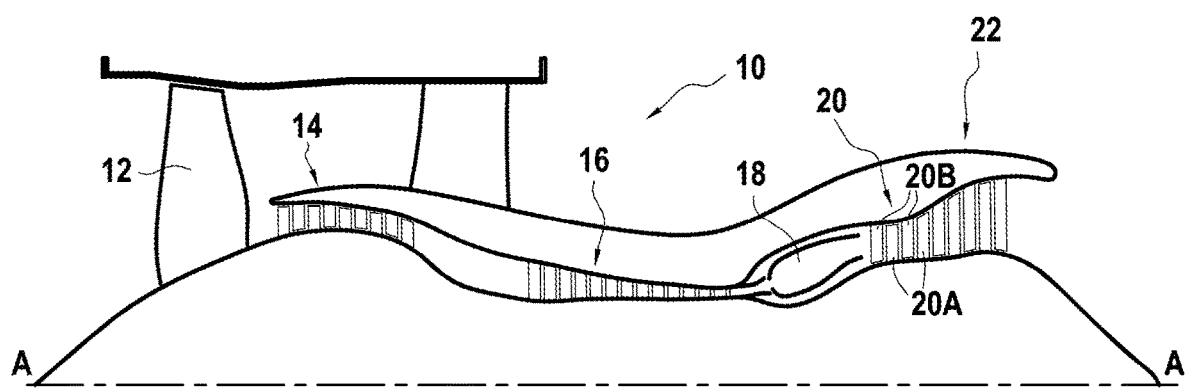

SUPERALLOY BASED ON NICKEL, MONOCRYSTALLINE BLADE AND TURBOMACHINE

CROSS-REFERENCE TO RELATED APPLICATIONS

This application is the U.S. national phase entry under 35 U.S.C. § 371 of International Application No. PCT/FR2017/052918, filed on Oct. 24, 2017, which claims priority to French Patent Application No. 1660337, filed on Oct. 25, 2016.

BACKGROUND OF THE INVENTION

The present disclosure relates to nickel-based superalloys for gas turbines, in particular for stationary blades, also known as vanes or nozzles, or for moving blades in a gas turbine, e.g. in the field of aeronaunotics.

It is known to use nickel-based superalloys for fabricating stationary or moving monocrystalline blades for gas turbines in airplane or helicopter engines.

The main advantages of these materials are to combine both high creep resistance at high temperature with good resistance to oxidation and corrosion.

Over time, nickel-based superalloys for monocrystalline blades have seen large changes in their chemical composition, in particular for the purpose of improving their high temperature creep performance while conserving good resistance to the very aggressive surroundings in which these superalloys are used.

Furthermore, metal coatings that are adapted to these alloys have been developed in order to increase their resistance to the aggressive surroundings in which these alloys are used, in particular resistance to oxidation and resistance to corrosion. Furthermore, a ceramic coating of low thermal conductivity, acting as a thermal barrier, may be added in order to reduce the temperature at the surface of the metal.

Typically, a complete protection system comprises at least two layers.

The first layer, also referred to as an underlayer or a bond coat layer, is deposited directly on the nickel-based superalloy part to be protected, also referred to as a substrate, e.g. a stationary or a moving blade. The deposition step is followed by a step of diffusion of the bond coat layer into the superalloy. Deposition and diffusion may also be performed in a single step.

The materials generally used for making this bond coat layer comprise alumina-forming metal alloys of the MCrAlY type (M=Ni (nickel) or Co (cobalt) or a mixture of Ni and Co, Cr=chromium, Al=aluminum and Y=Yttrium) or alloys of nickel aluminide type ($Ni_xAl_y$), some of which also contain platinum ($Ni_xAl_yPt_z$).

The second layer, generally referred to as a thermal barrier coating (TBC), is a ceramic coating, e.g. comprising yttria stabilized zirconia (YSZ) or yttria partially stabilized zirconia (YPSZ), and it possesses a porous structure. This layer may be deposited by various methods, such as electron beam physical vapor deposition (EB-PVD), atmospheric plasma spraying (APS), suspension plasma spraying (SPS), or any other method providing a porous ceramic coating having low thermal conductivity.

As a result of using these materials at high temperature, e.g. in the range 650° C. to 1150° C., interdiffusion phenomena arise at microscopic scale between the nickel-based superalloy of the substrate and the metal alloy of the bond coat layer. These interdiffusion phenomena, associated with oxidation of the bond coat layer, modify in particular the chemical composition, the microstructure, and consequently the mechanical properties of the bond coat layer, starting from fabrication of the coating and continuing with use of the blade in the turbine. These interdiffusion phenomena also modify the chemical composition, the microstructure, and consequently the mechanical properties of the superalloy of the substrate. In superalloys having very high contents of refractory elements, in particular rhenium, a secondary reaction zone (SRZ) may form in the superalloy, under the bond coat layer, over a depth of several tens or even hundreds of micrometers. The mechanical characteristics of this SRZ are very inferior to those of the superalloy of the substrate. SRZ formation is undesirable since it leads to a significant reduction in the mechanical strength of the superalloy.

These variations in the bond coat layer, associated with the stress fields associated with growing the layer of alumina that forms in operation on the surface of this bond coat layer, also known as thermally grown oxide (TGO), and with the differences in the coefficients of thermal expansion between the various layers, give rise to losses of cohesion in the interphase zone between the bond coat layer and the ceramic coating, which may lead to the ceramic coating spalling in part or in full. The metal portion (superalloy substrate and metal bond coat layer) is then laid bare and exposed directly to combustion gas, thereby increasing the risk of damaging the blade and thus the gas turbine.

OBJECT AND SUMMARY OF THE INVENTION

The present disclosure seeks to propose nickel-based superalloys for fabricating monocrystalline components presenting mechanical characteristics at very high temperature that are better than those of existing alloys, and to improve the resistance of the thermal barrier to spalling.

To this end, the present disclosure provides a nickel-based superalloy including, in mass percent: 4.0% to 6.0% chromium; 0.4% to 0.8% molybdenum; 2.5% to 3.5% rhenium; 6.2% to 6.6% tungsten; 5.2% to 5.7% aluminum; 0.0 to 1.6% titanium; 6% to 9.9% tantalum; 0 to 0.7% hafnium; and 0.0 to 0.3% silicon; the balance being constituted by nickel and any impurities.

This superalloy is for fabricating monocrystalline components for a gas turbine, such as stationary or moving blades.

By means of this superalloy based on nickel (Ni), resistance to creep is improved compared with existing superalloys, in particular at temperatures that may be as high as 1200° C., and the adhesion of the thermal barrier is strengthened compared with that observed on existing superalloys.

This alloy thus presents improved resistance to creep at high temperature. Since the lifetime of this alloy is thus long, this alloy also presents improved resistance to corrosion and to oxidation. This alloy may also present improved thermal fatigue resistance.

A nickel-based superalloy monocrystalline part is obtained by a directional solidification process under a temperature gradient while using lost wax casting. The nickel-based monocrystalline superalloy has an austenitic matrix of face centered cubic structure, nickel-based solid solution, referred to as the gamma ("γ") phase. This matrix contains precipitates of a gamma prime ("γ'") hardening phase of $L1_2$ ordered cubic structure of $Ni_3Al$ type. The combination (matrix and precipitates) is thus referred to as a γ/γ' superalloy.

Furthermore, this nickel-based superalloy composition is suitable for being subjected to heat treatment that puts the γ' phase precipitates and the γ/γ' eutectic phases that form during solidification of the superalloy totally back into solution. It is thus possible to obtain a nickel-based monocrystalline superalloy containing γ' precipitates of controlled size, preferably lying in the range 300 nanometers (nm) to 500 nm, and exempt from γ/γ' eutectic phases.

Treatment also makes it possible to control the volume fraction of the γ' phase precipitates present in the nickel-based monocrystalline superalloy. The volume percentage of γ' phase precipitates may be greater than or equal to 50%, preferably greater than or equal to 60%, more preferably equal to 70%.

Adding tungsten (W), chromium (Cr), rhenium (Re), or molybdenum (Mo) serves mainly to reinforce the γ austenitic matrix by hardening in solid solution.

Adding aluminum (Al), titanium (Ti), or tantalum (Ta) enhances precipitation of the γ' hardening phase $Ni_3(Al, Ti, Ta)$.

Rhenium (Re) serves to slow down the diffusion of chemical species within the superalloy and to limit the coalescence of γ' phase precipitates during operation at high temperature, a phenomenon that leads to a reduction in mechanical strength. Rhenium thus serve to improve the resistance to creep at high temperature of the nickel-based superalloy. Nevertheless, too great a concentration of rhenium may lead to intermetallic phases precipitating, e.g. phases σ, P, ou μ, also known as topologically close-packed (TCP) phases, which have a negative effect on the mechanical properties of the superalloy. Too great a concentration of rhenium may also cause a secondary reaction zone to form in the superalloy under the bond coat layer, thereby having a negative effect on the mechanical properties of the superalloy.

Simultaneous addition of silicon (Si) and of hafnium (Hf) serves to improve the resistance of nickel-based superalloys to oxidation when hot by increasing the adhesion of the alumina ($Al_2O_3$) layer that forms at the surface of the superalloy at high temperature. This alumina layer forms a passivation layer at the surface of the nickel-based superalloy and a barrier to diffusion of oxygen coming from the outside towards the inside of the nickel-based superalloy. Nevertheless, it is possible to add hafnium without also adding silicon, or vice versa to add silicon without also adding hafnium, and still improve the resistance of the superalloy to oxidation when hot.

Furthermore, adding chromium or aluminum serves to improve the resistance of the superalloy to oxidation and to corrosion at high temperature. In particular, chromium is essential for increasing the resistance of nickel-based superalloy to corrosion when hot. Nevertheless, too great a content of chromium tends to reduce the solvus temperature of the γ' phase of the nickel-based superalloy, i.e. the temperature above which the γ' phase is totally dissolved in the γ matrix, which is undesirable. The concentration of chromium thus lies in the range 4.0% to 6.0% by mass in order to conserve a high solvus temperature for the γ' phase of the nickel-based superalloy, e.g. higher than or equal to 1250° C., and also to avoid the formation of topologically compact phases in the γ matrix, which is highly saturated in elements such as rhenium, molybdenum, or tungsten.

Adding refractory elements, such as molybdenum, tungsten, rhenium, or tantalum serves to slow down the mechanisms that control creep in nickel-based superalloys and that depend on the diffusion of chemical elements in the superalloy.

It should also be observed that the nickel-based superalloy does not include cobalt (Co), which is an element that has the effect of reducing the solvus temperature of the γ' phase.

The term "impurities" is used to mean chemical elements present in the metal in undesired manner and in small quantity, for example elements having a concentration by mass that is less than or equal to 0.05%.

The term "nickel-based superalloys", is used to mean superalloys in which the percentage by mass of nickel is in the majority. It may thus be understood that nickel is the elements having the greatest percentage by mass in the alloy.

The superalloy may include, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.8% to 1.2% titanium; 6.3% to 9.2% tantalum; 0.3% to 0.7% hafnium; and 0.0 to 0.3% silicon; the balance being constituted by nickel and any impurities.

The superalloy may include, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.0 to 1.5% titanium; 6.3% to 6.7% tantalum; 0.3% to 0.7% hafnium; and 0.0 to 0.3% silicon; the balance being constituted by nickel and any impurities.

The superalloy may include, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.0 to 0.5% titanium; 8.8% to 9.2% tantalum; 0.3% to 0.7% hafnium; and 0.0 to 0.3% silicon; the balance being constituted by nickel and any impurities.

The superalloy may include, in mass percent: 5% chromium; 0.6% molybdenum; 3% rhenium; 6.4% tungsten; 5.5% aluminum; 1% titanium; 6.5% tantalum; 0.5% hafnium; and 0.0 to 0.1% silicon; the balance being constituted by nickel and any impurities.

The superalloy may include, in mass percent: 5% chromium; 0.6% molybdenum; 3% rhenium; 6.4% tungsten; 5.5% aluminum; 9% tantalum; 0.5% hafnium; and 0.0 to 0.1% silicon; the balance being constituted by nickel and any impurities.

The present disclosure also provides a monocrystalline blade for a turbine engine, the blade comprising a superalloy as defined above.

This blade thus presents improved resistance to creep at high temperature.

The blade may include a protective coating comprising a metal bond coat layer deposited on the superalloy and a ceramic thermal barrier deposited on the metal bond coat layer.

As a result of the composition of the nickel-based superalloy, the phenomena of interdiffusion between the superalloy and the bond coat layer reduce the formation of a secondary reaction zone in the superalloy, or even do not lead to such a zone forming.

As a result of the composition of the nickel-based superalloy, the resistance to spalling of the thermal barrier on the blade is strengthened compared with nickel-based superalloy blades of the prior art.

The metal bond coat layer may be an alloy of the MCrAlY type or alloys of the nickel aluminide type.

The ceramic thermal barrier may be a material based on yttria stabilized zirconia or on any other ceramic coating (based on zirconia) having low thermal conductivity.

The blade may present a structure oriented in a <001> crystallographic direction.

This orientation generally confers optimum mechanical properties on the blade.

The present disclosure also provides a turbomachine including a blade as defined above.

BRIEF DESCRIPTION OF THE DRAWINGS

Other characteristics and advantages of the invention appear from the following description of embodiments of the invention, given as nonlimiting examples, and with reference to the sole accompanying FIGURE, in which:

FIG. 1 is a diagrammatic longitudinal section view of a turbomachine.

DETAILED DESCRIPTION OF THE INVENTION

Nickel-based superalloys are for fabricating monocrystalline blades by a method of directional solidification in a temperature gradient. The use of a monocrystalline seed or of a grain selector at the beginning of solidification enables such a monocrystalline structure to be obtained. By way of example, the structure is oriented in a <001> crystallographic direction, which, as a general rule, is the orientation that imparts optimum mechanical properties to superalloys.

Raw solidified nickel-based monocrystalline superalloys have a dendritic structure and they are constituted by $Ni_3(Al, Ti, Ta)$ γ' precipitates dispersed in a γ matrix having a face centered cubic structure, nickel-based solid solution. These γ' phase precipitates are distributed in heterogeneous manner in the volume of the monocrystal because of chemical segregations resulting from the solidification method. Furthermore, γ/γ' eutectic phases are present in the inter-dendritic regions and constitute preferred sites for crack initiation. Furthermore, the γ/γ' eutectic phases are formed to the detriment of precipitates that are fine (size less than one micrometer) of the hardening γ' phase. These γ' phase precipitates constitute the main source of hardening in nickel-based superalloys. Also, the presence of residual γ/γ' eutectic phases does not allow the hot creep strength of the nickel-based superalloy to be optimized.

Specifically, it has been shown that the mechanical properties of superalloys, and in particular creep strength, are optimized when the precipitation of γ' precipitates is ordered, with size lying in the range 300 nm to 500 nm, and when the γ/γ' eutectic phases are put fully into solution.

Raw solidified nickel-based superalloys are thus subjected to heat treatment in order to obtain the desired distribution of the various phases. The first heat treatment is a homogeneization heat treatment of the microstructure, and it seeks to dissolve the γ' phase precipitates and the γ/γ' eutectic phases. This treatment is performed at a temperature higher than the solvus temperature of the γ' phase. Quenching is then performed at the end of this first heat treatment in order to obtain a fine and uniform dispersion of γ' precipitates. Annealing heat treatments are then performed in two steps, at temperatures lower than the solvus temperature of the γ' phase. During a first step, in order to enlarge the γ' precipitates and obtain the desired size, and then during a second step in order to increase the volume fraction of this phase up to about 70%.

EXAMPLES

Two nickel-based monocrystalline superalloys of the present disclosure (Ex 1 and Ex 2) were studied and compared with three commercial monocrystalline superalloys CMSX-4 (Ex 3), AM1 (Ex 4), and MC2 (Ex 5). The chemical composition of each of the monocrystalline superalloys is given in Table 1. All of the superalloys are nickel-based superalloys, i.e. the balance up to 100% of the concentrations given in Table 1 is constituted by nickel and by any impurities.

TABLE 1

|      | Co  | Cr  | Mo  | Re | W   | Al  | Ti  | Ta  | Hf  | Si  |
|------|-----|-----|-----|----|-----|-----|-----|-----|-----|-----|
| Ex 1 | —   | 5   | 0.6 | 3  | 6.4 | 5.5 | 1   | 6.5 | 0.5 | 0.1 |
| Ex 2 | —   | 5   | 0.6 | 3  | 6.4 | 5.5 | —   | 9   | 0.5 | 0.1 |
| Ex 3 | 9   | 6.5 | 0.6 | 3  | 6   | 5.6 | 1   | 6.5 | 0.1 | —   |
| Ex 4 | 6.5 | 7.5 | 2   | —  | 5.5 | 5.3 | 1.2 | 8   | 0.1 | —   |
| Ex 5 | 5   | 8   | 2   | —  | 8   | 5   | 1.5 | 6   | 0.1 | 0.1 |

Creep Strength

Table 2 presents the results of a creep strength test under argon (Ar) at 1200° C. while applying a stress of 80 megapascals (MPa), as performed on the superalloys Ex 1 to Ex 5. Creep strength is quantified by the lifetime of the testpiece, expressed in hours (h), i.e. the time that elapses between the testpiece beginning to be loaded at 1200° C. and the testpiece breaking.

TABLE 2

| Superalloys | Lifetime (h) |
|-------------|--------------|
| Ex 1        | 90           |
| Ex 2        | 50           |
| Ex 3        | 25           |
| Ex 4        | 4            |
| Ex 5        | 3            |

As may be seen, the superalloys Ex 1 and Ex 2 present a creep-to-break lifetime that is much greater than that of the comparison superalloys CMSX-4 (Ex 3), AM1 (Ex 4), and MC2 (Ex 5). The superalloys Ex 1 and Ex 2 may thus either withstand operating stresses that are greater than those that may be withstood by the comparison superalloys, for comparable lifetimes, or else they may present longer lifetimes under comparable stresses.

Resistance of the Protective Coating

In order to study the compatibility of superalloys Ex 1 to Ex 5 with the coating (metal bond coat layer and ceramic thermal barrier), tests were carried out of the resistance of the thermal barrier to cyclic oxidation.

Those tests, carried out in air, consisted in repeating an individual thermal cycle comprising a step of heating up to 1100° C. for about 10 minutes, followed by maintaining the temperature at 1100° C., with the total duration of those two steps being 1 h, followed by forced cooling over about 12 minutes down to a temperature of less than 100° C.

The test was stopped when the testpiece presented spalling at the ceramic thermal barrier over at least 20% of the area of the testpiece, i.e. when the ceramic thermal barrier occupied less than 80% of the area of the testpiece. That measurement may be performed by image analysis.

The superalloys Ex 1 to Ex 5 were coated in a metal bond coat layer of NiPtAl type followed by a ceramic thermal barrier of yttria stabilized zirconia type deposited by EB-PVD. The yttria stabilized zirconia was of 8YPSZ type, which is an yttria stabilized zirconia having 8% by mass of yttrium oxide ($Y_2O_3$).

The results of those tests are given in Table 3, which shows the number of cycles performed at 1100° C. on each testpiece before the test was stopped.

The dispersion of the results of the various tests carried out on each type of superalloy is represented by an uncertainty expressed as a number of cycles that might be added or subtracted from the value of the number of cycles in column 2 of Table 3. For each alloy, the test was carried out on at least three distinct testpieces.

TABLE 3

| Superalloys | Number of cycles | Uncertainty (No. of cycles) |
| --- | --- | --- |
| Ex 1 | 4500 | 500 |
| Ex 2 | 4300 | 500 |
| Ex 3 | 2050 | 500 |
| Ex 4 | 1450 | 250 |

It may be seen that the testpieces having the compositions Ex 1 and Ex 2 as their substrates are capable of withstanding a number of cycles between 1100° C. and a temperature lower than 100° C. in an oxidizing atmosphere before the thermal barrier spalls over more than 20% of the area of the testpiece that is much greater than the number of cycles that the testpieces having as their substrates the compositions Ex 3 and Ex 4 are capable of withstanding.

At the end of the thermal cycling tests between 1100° C. and the temperature of less than 100° C., the microstructure of the coated testpieces having the compositions Ex 1 and Ex 2 as their substrates was inspected. Optical microscope observations revealed the absence of a secondary reaction zone in the superalloy substrate under the metal bond coat layer of NiPtAl type.

In conclusion, the superalloys of the present disclosure present firstly creep properties at very high temperature (1200° C.) that are better than those of the commercial alloys CMSX-4, AM1, and MC2 (Ex 3 to Ex 5). Furthermore, these superalloys enable the lifetime of the thermal barrier to be improved. Finally, these alloys are not sensitive to the formation of a secondary reaction zone under the coating of the thermal barrier. These superalloys thus make it possible to increase the lifetime of parts (e.g. turbine blades) at high temperature that are made out of these superalloys, in particular when those parts have a protective coating.

FIG. 1 shows a bypass jet engine 10 seen in section on a vertical plane containing its main axis A. From upstream to downstream in the flow direction of the air stream, the bypass jet engine 10 comprises a fan 12, a low-pressure compressor 14, a high-pressure compressor 16, a combustion chamber 18, a high-pressure turbine 20, and a low-pressure turbine 22.

The high-pressure turbine 20 has a plurality of blades 20A that rotate with the rotor, and vanes 20B (stationary blades) that are mounted on the stator. The stator of the turbine 20 has a plurality of stator rings (not shown) arranged facing the blades 20A of the turbine 20.

These properties thus make these superalloys advantageous candidates for fabricating monocrystalline parts that are for the hot portions of jet engine.

It is thus possible to fabricate a moving blade 20A or a vane 20B for a turbine engine comprising a superalloy as defined above.

It is also possible to fabricate a moving blade 20A or a vane 20B for a turbine engine comprising a superalloy as defined above coated in a protective coating comprising a metal bond coat layer.

A turbine engine may in particular be a turbojet such as a bypass turbojet 10. The turbine engine could equally well be a single-flow turbojet, a turboprop, or a turboshaft engine.

Although the present disclosure is described with reference to a specific implementation, it is clear that various modifications and changes may be undertaken on those implementations without going beyond the general ambit of the invention as defined by the claims. Also, individual characteristics of the various implementations mentioned above may be combined in additional implementations. Consequently, the description and the drawings should be considered in a sense that is illustrative rather than restrictive.

The invention claimed is:

1. A nickel-based superalloy including, in mass percent: 4.0% to 6.0% chromium; 0.4% to 0.8% molybdenum; 2.5% to 3.5% rhenium; 6.2% to 6.6% tungsten; 5.2% to 5.7% al0uminum; 0.0 to 1.6% titanium; 6.0% to 9.9% tantalum; 0.0 to 0.7% hafnium; and 0.0 to 0.3% silicon; the balance being constituted by nickel and any impurities, wherein the nickel-based superalloy has a creep strength quantified by a lifetime of 50-90 hours under a load of 80 MPa at 1200°C.

2. The superalloy according to claim 1, consisting of, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.8% to 1.2% titanium; 6.3% to 9.2% tantalum; 0.3% to 0.7% hafnium; and 0.0 to 0.3% silicon; the balance being constituted by nickel and any impurities.

3. The superalloy according to claim 1, consisting of, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.0 to 1.5% titanium; 6.3% to 6.7% tantalum; 0.3% to 0.7% hafnium; and 0.0 to 0.3% silicon; the balance being constituted by nickel and any impurities.

4. The superalloy according to claim 1, consisting of, in mass percent: 4.8% to 5.2% chromium; 0.4% to 0.8% molybdenum; 2.8% to 3.2% rhenium; 6.2% to 6.6% tungsten; 5.2% to 5.7% aluminum; 0.0 to 0.5% titanium; 8.8% to 9.2% tantalum; 0.3% to 0.7% hafnium; and 0.0 to 0.3% silicon; the balance being constituted by nickel and any impurities.

5. The superalloy according to claim 1, consisting of, in mass percent: 5% chromium; 0.6% molybdenum; 3% rhenium; 6.4% tungsten; 5.5% aluminum; 1% titanium; 6.5% tantalum; 0.5% hafnium; and 0.0 to 0.1% silicon; the balance being constituted by nickel and any impurities.

6. The superalloy according to claim 1, consisting of, in mass percent: 5% chromium; 0.6% molybdenum; 3% rhenium; 6.4% tungsten; 5.5% aluminum; 9% tantalum; 0.5% hafnium; and 0.0 to 0.1% silicon; the balance being constituted by nickel and any impurities.

7. A monocrystalline blade for a turbine engine, the blade comprising a superalloy according to claim 1.

8. The blade according to claim 7, further comprising:
a protective coating comprising a metal bond coat layer deposited on the superalloy; and
a ceramic thermal barrier deposited on the metal bond coat layer.

9. The blade according to claim 7, presenting a structure oriented in a <001> crystallographic direction.

10. A turbomachine including a blade according claim 7.

11. A nickel-based superalloy consisting essentially of, in mass percent: 4.0% to 6.0% chromium; 0.4% to 0.8% molybdenum; 2.5% to 3.5% rhenium; 6.2% to 6.6% tungsten; 5.2% to 5.7% aluminum; 0.0 to 1.6% titanium; 6.0% to 9.9% tantalum; 0.0 to 0.7% hafnium; and 0.0 to 0.3% silicon; the balance being constituted by nickel and any impurities, wherein the nickel-based superalloy has a creep strength quantified by a lifetime of 50-90 hours under a load of 80 MPa at 1200° C.

\* \* \* \* \*